United States Patent
Cheng

(10) Patent No.: US 9,123,637 B2
(45) Date of Patent: Sep. 1, 2015

(54) SEMICONDUCTOR EPITAXIAL STRUCTURE AND METHOD FOR FORMING THE SAME

(71) Applicant: Enkris Semiconductor, Inc., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 0 days.

(21) Appl. No.: 14/143,628

(22) Filed: Dec. 30, 2013

(65) Prior Publication Data

US 2015/0187885 A1    Jul. 2, 2015

(51) Int. Cl.

| | |
|---|---|
| H01L 29/06 | (2006.01) |
| H01L 31/072 | (2012.01) |
| H01L 31/109 | (2006.01) |
| H01L 31/0328 | (2006.01) |
| H01L 31/0336 | (2006.01) |
| H01L 29/20 | (2006.01) |
| H01L 33/00 | (2010.01) |

(Continued)

(52) U.S. Cl.
CPC ........ *H01L 29/2003* (2013.01); *H01L 21/0242* (2013.01); *H01L 21/0254* (2013.01); *H01L 21/02378* (2013.01); *H01L 21/02381* (2013.01); *H01L 21/02458* (2013.01); *H01L 29/15* (2013.01); *H01L 29/201* (2013.01); *H01L 29/205* (2013.01); *H01L 29/66462* (2013.01); *H01L 29/7787* (2013.01); *H01L 31/03044* (2013.01); *H01L 31/035236* (2013.01); *H01L 31/1852* (2013.01); *H01L 31/1856* (2013.01); *H01L 33/0025* (2013.01); *H01L 33/0066* (2013.01); *H01L 33/0075* (2013.01); *H01L 33/06* (2013.01); *H01L 33/32* (2013.01)

(58) Field of Classification Search
CPC ..... H01L 29/06; H01L 31/072; H01L 31/109; H01L 31/0328; H01L 31/0336; H01L 33/32
USPC .................................. 257/13, 94; 438/46, 47
See application file for complete search history.

(56) References Cited

U.S. PATENT DOCUMENTS

| | | | |
|---|---|---|---|
| 6,775,314 B1 | 8/2004 | Waldrip et al. | |
| 8,664,663 B2 * | 3/2014 | Konno et al. | 257/76 |

(Continued)

FOREIGN PATENT DOCUMENTS

| | | |
|---|---|---|
| CN | 101140867 A | 3/2008 |
| CN | 101645480 A | 2/2010 |

*Primary Examiner* — Phuc Dang
(74) *Attorney, Agent, or Firm* — Pearne & Gordon LLP

(57) ABSTRACT

A semiconductor epitaxial structure is provided, which includes: a nitride nucleation layer, formed on a substrate including silicon, sapphire, patterned sapphire substrate (PSS) or silicon carbide, a nitride layer on the nitride nucleation layer and an multi-layer structure in the nitride layer. The multi-layer structure includes a first intermediate layer and a second intermediate layer formed on the first intermediate layer. The first intermediate layer includes AlGaN, the second intermediate layer includes AlGaN or aluminum nitride, and the average composition of Al in the first intermediate layer is less than that in the second intermediate layer. A method for forming a semiconductor epitaxial structure is provided. The semiconductor epitaxial structure according to the present disclosure can not decrease the crystalline quality when a compressive stress is introduced, which may avoid a crack phenomenon or quality degradation caused by the change of temperature.

18 Claims, 3 Drawing Sheets

(51) Int. Cl.
*H01L 33/06* (2010.01)
*H01L 33/32* (2010.01)
*H01L 31/18* (2006.01)
*H01L 31/0304* (2006.01)
*H01L 31/0352* (2006.01)
*H01L 29/201* (2006.01)
*H01L 29/205* (2006.01)
*H01L 29/15* (2006.01)
*H01L 29/778* (2006.01)
*H01L 29/66* (2006.01)
*H01L 21/02* (2006.01)

(56) References Cited

U.S. PATENT DOCUMENTS

| | | | |
|---|---|---|---|
| 2008/0220555 A1* | 9/2008 | Saxler et al. | 438/47 |
| 2008/0247435 A1 | 10/2008 | Choi | |
| 2014/0014897 A1* | 1/2014 | Kim et al. | 257/13 |
| 2014/0091314 A1* | 4/2014 | Ishiguro et al. | 257/76 |
| 2014/0197418 A1* | 7/2014 | Chen et al. | 257/76 |

* cited by examiner

SEMICONDUCTOR EPITAXIAL STRUCTURE AND METHOD FOR FORMING THE SAME

TECHNICAL FIELD

The present disclosure generally relates to semiconductor technology field, and more particularly, to a semiconductor epitaxial structure and a method for forming the same.

BACKGROUND

Because gallium nitride, the 3rd generation wide-band gap semiconductor material, has properties of wide band gap, high saturated electron drift velocity, high critical electric field and high thermal conductivity, it is more suitable for making high-temperature, high-frequency, high-pressure and high-power power switching devices than silicon and gallium arsenide. GaN devices have a good application prospect in a high-frequency and high-power microwave devices. Since 1990s, the development of GaN devices has been a research focus of power electronic devices. Due to the lack of GaN native substrates, GaN devices are grown on heterogeneous substrates, such as sapphire, silicon carbide or silicon. Among these substrates, silicon substrate has the largest size and the lowest cost. Therefore, the GaN materials and GaN devices grown on a silicon substrate attracts extensive attention.

However, it is difficult to grown GaN epitaxial layers on a silicon substrate due to huge lattice mismatch and thermal mismatch between the silicon substrate and the epitaxial nitride layers. Thus, an AlN nucleation layer is generally required to be grown first to prevent the melt back etching of the silicon substrate by gallium atoms, especially in the ammonia ambient. In addition, it is difficult to obtain a homogeneous and continuous GaN epitaxial layer, since GaN has a poor wetting property on the silicon substrate. A high-quality aluminum nitride nucleation layer is essential when growing a GaN device on a silicon substrate. With the aid of the nitride nucleation layer, a homogeneous and continuous GaN epitaxial layer with a smooth surface can be grown on the silicon substrate. However, because of the large thermal mismatch between GaN and Si, a huge tensile stress is generated during cooling down to the room temperature after the GaN layer is grown at a high temperature. When the GaN epitaxial layer thickness exceeds a critical value (e.g., 1 μm), the epitaxial layer may crack. To avoid the crack generation, a compressive stress may be introduced to the epitaxial structures at high temperature. If the average value of the compressive stress is equal to that of the tensile stress, the warpage of the silicon substrate can be minimized.

The method of introducing compensatory compressive stress at a high temperature is referred as stress engineering. The stress engineering usually introduces a stress according to the lattice mismatch between epitaxial layers and the substrates. If the lattice constant of the substrate is less than that of the epitaxial layer, a compressive stress may be introduced; otherwise, if the lattice constant of the substrate is greater than that of the epitaxial layer, a tensile stress may be introduced. The conventional method may include: forming a low-temperature AlN interlayer, which may refer to the article published on "Appl. Phys. Lett. Volume 80, Issue 20" issued in 2002 by A. Dadgar et al., or the article published on "Japanese Journal of Applied Physics, Volume 37, Issue 12B, pp. L1540-L1542" issued in 1998 by Hiroshi Amano et al.; forming an AlN/AlGaN superlattice structure, which may refer to the article published on "Appl. Phys. Lett. v81, p 604" issued in 2002 by Hong-Mei Wang et al.; or forming a GaN/AlGaN superlattice structure, which may refer to the article published on "Appl. Phys. Lett. v75, p 2073" issued in 1999 by S. A. Nikishin et al.; or forming an AlN/GaN superlattice structure, which may refer to the article published on "Appl. Phys. Lett. v79, p 3230" issued in 2001 by Eric Feltin et al.

The low-temperature AlN interlayer is initially used to grow a crack-free AlGaN epitaxial layer on a GaN template. Because the lattice constant of AlGaN is less than that of GaN, the growth stress in AlGaN is thus tensile stress. When the AlGaN epitaxial layer has a thickness greater than the critical value, the epitaxial layer may introduce cracks and no device can be fabricated then. By introducing the low-temperature AlN interlayer, the tensile stress may be compensated effectively and the crack generation can be avoided. Afterwards, this method is used to grown crack-free GaN epitaxial layers on silicon substrates. However, the low-temperature AlN interlayer may have influence on the crystalline quality of the GaN epi-layers. It has been found that the quality of the GaN epitaxial layer may be degraded greatly after the introduction of the low-temperature AlN interlayer. Edge type dislocations are generated at the interface between the low-temperature AlN interlayer and the GaN epitaxial layer, which increases the overall dislocation density. Furthermore, unexpected particles may be generated due to temperature ramping, which may decrease production yield.

SUMMARY

Embodiments of the present disclosure provide a semiconductor epitaxial structure and a method for forming the same. The semiconductor epitaxial structure has a multi-layer structure including a sandwich structure, where the stress can be controlled by adjusting the composition of Al in the sandwich structure. It is difficult to grow an epitaxial layer rich in Al on a nitride layer in prior art, a pre-stress layer is introduced in the present disclosure to protect the bottom nitride layer. The pre-stress layer may change the growth pattern of the inserted Al-rich layer, to achieve a two-dimensional structure. Both the nitride layer and the sandwich-like multilayer are formed at high temperature, which avoids a complicated temperature ramping process during low temperature AlN interlayer growth, thereby saving time and increasing manufacturing yield. Furthermore, the degradation of the crystalline quality caused by the low temperature AlN interlayer can be avoided. Because all the structures are grown at a high temperature, the crystalline quality is improved greatly and the defects can be minimized.

In one embodiment, a semiconductor epitaxial structure is provided, which may include:
a nitride nucleation layer grown on a substrate including silicon, sapphire, patterned sapphire substrate (PSS) or silicon carbide;
a nitride layer including a first nitride layer and a second nitride layer formed on the nitride nucleation layer; and
a multi-layer structure formed between the first nitride layer and the second nitride layer, wherein the multi-layer structure includes a first intermediate layer and a second intermediate layer formed on the first intermediate layer, the first intermediate layer includes AlGaN, the second intermediate layer includes AlGaN or aluminium nitride (AlN), and the average composition of Al in the first intermediate layer is less than that in the second intermediate layer.

In some embodiments, the multi-layer structure may further include a third intermediate layer formed on the second intermediate layer, wherein the third intermediate layer may include AlGaN, and an average composition of Al in the third intermediate layer is less than that in the second intermediate layer.

In some embodiments, the first intermediate layer may have a GaN/AlGaN or AlGaN/AlGaN superlattice structure.

In some embodiments, the second intermediate layer may have a thickness greater than 2 nm.

In some embodiments, the semiconductor epitaxial structure may include an active region formed on the nitride layer, wherein the active region may be selected from a light-emitting diode including a InGaN/GaN multiple quantum well structure and p-type nitride, a high electron mobility transistor including an AlGaN/GaN heterostructure, a high electron mobility transistor including an AlInGaN/GaN heterostructure, a high mobility transistor including an AlN/GaN heterostructure, a GaN MOSFET, a UV-LED, a photoelectric detector, a hydrogen generator or a solar cell.

In some embodiments, the average composition of Al in the first intermediate layer increases gradually from bottom to top.

In some embodiments, the average composition of Al in the third heterostructure layer decreases gradually from bottom to top.

In some embodiments, the nitride nucleation layer may include AlGaN, AlInGaN, aluminium nitride or gallium nitride.

In some embodiments, the nitride layer may include gallium nitride, AlInGaN or AlGaN.

In some embodiments, the multi-layer structure may be n-type doped with silicon or/and germanium.

In some embodiments, the nitride layer may be n-type doped with silicon or/and germanium.

Correspondingly, a method for forming a semiconductor epitaxial structure is provided, which may include:

(1) providing a substrate including silicon, sapphire, patterned sapphire substrate (PSS) or silicon carbide;

(2) forming a nitride nucleation layer on the substrate including silicon sapphire, patterned sapphire substrate (PSS) or silicon carbide;

(3) forming a first nitride layer on the nitride nucleation layer;

(4) forming a first intermediate layer on the first nitride layer;

(5) forming a second intermediate layer on the first intermediate layer; and (6) forming a second nitride layer on the second intermediate layer.

In some embodiments, a growth temperature of the nitride nucleation layer is equal to or greater than 700° C.

In some embodiments, a growth temperature of the nitride layer is equal to or greater than 700° C.

In some embodiments, a growth temperature of the first intermediate layer or the second intermediate layer is equal to or greater than 700° C.

Compared with the prior art, this disclosure has the following advantages:

The semiconductor epitaxial structure provided in embodiments of the present disclosure has a multi-layer structure in a nitride layer, wherein the multi-layer structure includes a first intermediate layer and a second intermediate layer formed on the first intermediate layer, the first intermediate layer may include AlGaN, the second intermediate layer may include AlGaN or aluminium nitride, and the average composition of Al in the first intermediate layer is less than that in the second intermediate layer. The stress can be controlled by adjusting the composition of Al in the multi-layer structure. It is difficult to growth an Al-rich epitaxial layer especially on GaN in the prior art, a pre-stress layer is introduced in the present disclosure (the first intermediate layer or the third intermediate layer) to protect the bottom nitride layer. The pre-stress layer may change the growth pattern of the Al-rich intermediate layer (the second intermediate layer), to achieve a two-dimensional structure. Both the nitride layer and the multilayer structure are grown at high temperature, which may avoid a complicated temperature ramping process during low temperature AlN interlayer growth, thereby saving time and increasing manufacturing yield. Furthermore, the degradation of the crystalline quality caused by the low temperature AlN interlayer can be avoided. Because all the structures are grown at high temperature, the crystalline quality is improved greatly and the defects can be minimized.

BRIEF DESCRIPTION OF THE DRAWINGS

A further understanding of the nature and advantages of various embodiments may be realized by reference to the following figures. The accompanying drawings are presented for descriptive purpose, but not intended to be limiting. To those skilled in the art, other accompanying drawings may be obtained according to the disclosure without creative work.

DETAILED DESCRIPTION

Embodiments of the present disclosure provide a semiconductor epitaxial structure, which may include:

a nitride nucleation layer formed on a substrate including silicon sapphire, patterned sapphire substrate (PSS), or silicon carbide;

a nitride layer including a first nitride layer and a second nitride layer formed on the nitride nucleation layer; and a multi-layer structure formed between the first nitride layer and the second nitride layer, wherein the multi-layer structure includes a first intermediate layer and a second intermediate layer formed on the first intermediate layer, the first intermediate layer includes AlGaN, the second intermediate layer includes AlGaN or aluminium nitride, and the average composition of Al in the first intermediate layer is less than that in the second intermediate layer.

Correspondingly, embodiments of the present disclosure provide a method for forming a semiconductor epitaxial structure, which may include:

(1) providing a substrate including silicon, sapphire, patterned sapphire substrate (PSS), or silicon carbide;

(2) forming a nitride nucleation layer on the substrate including silicon, sapphire, patterned sapphire substrate (PSS), or silicon carbide;

(3) forming a first nitride layer on the nitride nucleation layer;

(4) forming a first intermediate layer on the first nitride layer;

(5) forming a second intermediate layer on the first intermediate layer; and (6) forming a second nitride layer on the second intermediate layer.

The multi-layer structure provided in embodiments of the present disclosure is grown at high temperature, which may avoid epi-layer cracks due to the tensile stress. Furthermore, the crystalline quality would not deteriorate. In one embodiment, the growth temperature of the multi-layer structure is higher than 700° C. and a better crystalline quality can be obtained, compared with that obtained at a low temperature. Besides, the multi-layer structure may be repeatedly used.

The disclosure will be described with reference to certain embodiments. It will be understood by those skilled in the art that various changes may be made without departing from the spirit or scope of the disclosure. Accordingly, the present disclosure is not limited to the embodiments disclosed.

Figure 1:
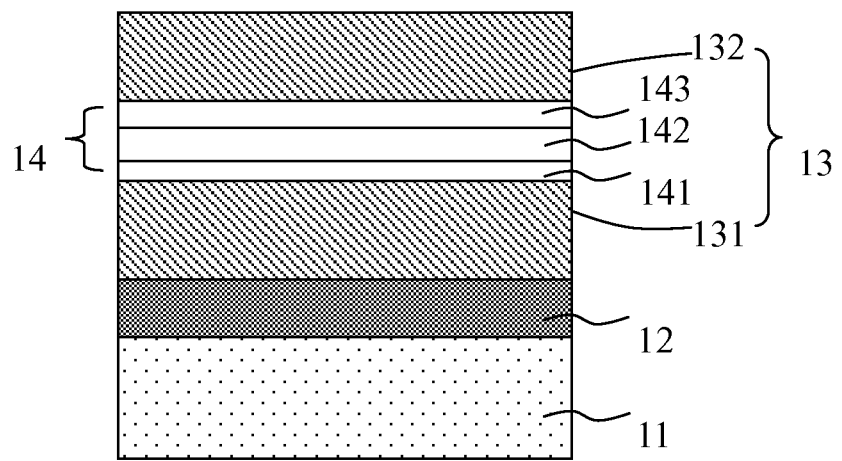
FIG. 1 schematically illustrates a cross-sectional view of a semiconductor epitaxial structure according to a first embodiment of the present disclosure.

FIG. 1 schematically illustrates a cross-sectional view of a semiconductor epitaxial structure according to a first embodiment of the present disclosure.

Referring to FIG. 1, an epitaxial structure is formed on a substrate 11 including silicon, sapphire, patterned sapphire (PSS) or silicon carbide. The epitaxial structure includes: a nitride nucleation layer 12, a nitride layer 13, a multi-layer structure 14 formed in the nitride layer 13, and an active region (not shown) formed on the nitride layer 13. The nitride layer 13 includes a first nitride layer 131 and a second nitride layer 132. The multi-layer structure 14 is formed between the first nitride layer 131 and the second nitride layer 132.

The nitride nucleation layer 12 may include AlGaN, AlInGaN, aluminium nitride or gallium nitride.

The nitride layer 13 may include gallium nitride, AlInGaN or AlGaN. The nitride layer 13 may be n-type doped with silicon or/and germanium.

The multi-layer structure 14 has a three-layer structure including a first intermediate layer 141, a second intermediate layer 142 and a third intermediate layer 143 from bottom to top. The first intermediate layer 141 may include AlGaN, the second intermediate layer 142 may include AlGaN or aluminium nitride, and the third intermediate layer 143 may include AlGaN. The average composition of Al in the first intermediate layer 141 and the third intermediate layer 143 is less than that in the second intermediate layer 142. The second intermediate layer 142 may have a thickness greater than 2 nm. The multi-layer structure 14 may be n-type doped with silicon and/or germanium.

The active region may be selected from a light-emitting diode including a InGaN/GaN multiple quantum well structure and p-type nitride, a high electron mobility transistor including an AlGaN/GaN heterostructure, a high electron mobility transistor including an AlInGaN/GaN heterostructure, a high mobility transistor including an AlN/GaN heterostructure, a GaN MOSFET, a UV-LED, a photoelectric detector, a hydrogen generator or a solar cell.

The method for forming the epitaxial structure mentioned above may include:

(1) providing a substrate 11 including silicon, sapphire, patterned sapphire (PSS) or silicon carbide;

(2) forming a nitride nucleation layer 12 on the substrate 11 including silicon, sapphire, patterned sapphire (PSS) or silicon carbide, wherein a growth temperature of the nitride nucleation layer 12 is equal to or greater than 700° C.;

(3) forming a first nitride layer 131 on the nitride nucleation layer 12, wherein a growth temperature of the first nitride layer 131 is equal to or greater than 700° C.;

(4) forming a first intermediate layer 141 on the first nitride layer 131, wherein a growth temperature of the first intermediate layer 141 is equal to or greater than 700° C.;

(5) forming a second intermediate layer 142 on the first intermediate layer 141, wherein a growth temperature of the second intermediate layer 142 is equal to or greater than 700° C.;

(6) forming a third intermediate layer 143 on the second intermediate layer 142, wherein a growth temperature of the third intermediate layer 143 is equal to or greater than 700° C.;

(7) forming a second nitride layer 132 on the third intermediate layer 143, wherein a growth temperature of the second nitride layer 132 is equal to or greater than 700° C.; and (8) forming an active region on the second nitride layer 132.

In the first embodiment, the multi-layer structure 14 has a three-layer structure, wherein the first intermediate layer 141 is a thin AlGaN layer, the second intermediate layer 142 is an AlGaN layer rich in Al, and the third intermediate layer 143 is an AlGaN layer. The Al compositions of the first intermediate layer 141 and the third intermediate layer 143 are less than that of the second intermediate layer 142.

In the embodiment, the nitride nucleation layer 12 and the nitride layer 13 grown on the substrate 11 including silicon, sapphire, patterned sapphire (PSS) or silicon carbide are formed at a high temperature. The multi-layer structure 14 is formed at a high temperature as well. Compared with an AlN intermediate layer formed at a low temperature, the multi-layer structure 14 formed at a high temperature has a relatively more complicated structure. In some embodiments, the multi-layer structure formed at a high temperature may have a multi-layer structure. The first intermediate layer 141 of the multi-layer intermediate layer 14 is an AlGaN layer for protecting the nitride layer 13 and the second intermediate layer 142 underlying thereof. The second intermediate layer 142 is an AlGaN layer rich in Al or an AlN layer, which may introduce a compressive stress into an upper layer (e.g., the second nitride layer). The third intermediate layer 143 is an AlGaN layer which has an Al composition less than the second intermediate layer 142, so as to transfer the compressive stress to the nitride layer 13 effectively.

AlN and GaN are formed under extremely different conditions, where AlN is formed at a higher growth temperature and a lower pressure than GaN. Because there is a strong gaseous reaction between ammonia gas and trimethylaluminum, plenty of particles may be generated which may decrease growth speed and crystalline quality. Therefore, the flow of ammonia gas which is fed into a cavity is required to be very low, so as to avoid excessive gaseous reaction. However, when growing GaN, a large amount of ammonia gas is required to keep a smooth surface. Further, the decomposition of GaN may be accelerated greatly due to the lack of ammonia gas, since the decomposition temperature of GaN is only 700° C. Therefore, when growing AlN on GaN, if the growth conditions are configured according to the property of AlN, it will be difficult to obtain a flat epitaxial layer, because of the decomposition of the GaN layer below. If an AlGaN epitaxial layer is grown first under the condition of sufficient ammonia gas, the GaN layer below may be protected well, which may avoid the decomposition problem. Therefore, when AlN is grown on the AlGaN layer rich in Al, the overall profile of the epitaxial layer may be optimized and improved.

The AlN layer grown on the GaN layer has a critical thickness of about 7 nm. In order to introduce a compressive stress to the nitride layer 13ep, an AlN layer with a thickness greater than the critical thickness needs to be grown, so as to release a tensile stress introduced by the GaN layer. Therefore, the AlN intermediate layer is required to have a thickness greater than 8 nm. In order to further release the tensile stress introduced by the GaN layer, the AlN intermediate layer may have a thickness greater than 10 nm, 15 nm or even 20 nm. When the AlN intermediate layer has a thickness sufficiently greater than the critical thickness, it is approximate that the growth stress in the AlN intermediate layer is fully relaxed. Therefore, when AlGaN or GaN is grown on the AlN intermediate layer having no stress, a compressive stress may be introduced satisfactorily. Furthermore, the AlN intermediate layer is grown at a high temperature without introduction of additional defects. If an AlGaN layer is added between the AlN intermediate layer and the GaN epitaxial layer, the transfer of the compressive stress may be more effective. Under protection of the underlying AlGaN layer, the AlN intermediate layer has a smooth surface, which may introduce a large compressive stress to the epitaxial layer above.

In order to increase conductivity in the vertical direction of a LED device, the multi-layer structure may be n-type doped, for example, the multi-layer structure may be doped with silicon or germanium.

For a power device, two dimensional electron gas is prevented to be generated at an interface in the buffer layer, so as to maintain a high breakdown voltage.

Figure 2:
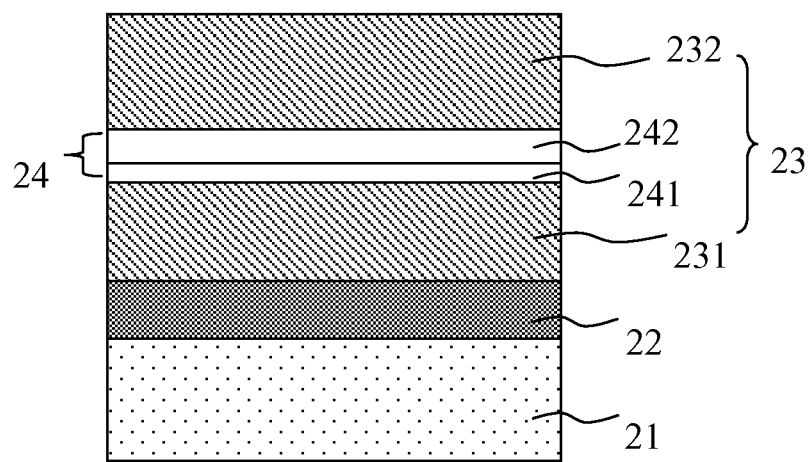
FIG. 2 schematically illustrates a cross-sectional view of a semiconductor epitaxial structure according to a second embodiment of the present disclosure.

FIG. 2 schematically illustrates a cross-sectional view of a semiconductor epitaxial structure according to a second embodiment of the present disclosure.

Referring to FIG. 2, an epitaxial structure is formed on a substrate 21 including silicon, sapphire, patterned sapphire (PSS) or silicon carbide. The epitaxial structure includes: a nitride nucleation layer 22, a nitride layer 23, a multi-layer structure 24 formed in the nitride layer 23 and an active region (not shown) formed on the nitride layer 23. The nitride layer 23 includes a first nitride layer 231 and a second nitride layer 232. The multi-layer structure 24 is formed between the first nitride layer 231 and the second nitride layer 232.

The nitride nucleation layer 22 may include AlGaN, AlInGaN, aluminium nitride or gallium nitride.

The nitride layer 23 may include gallium nitride, AlInGaN or AlGaN. The nitride layer 23 may be n-type doped with silicon or/and germanium.

The multi-layer structure 14 has a two-layer structure including a first intermediate layer 241 and a second intermediate layer 242 from bottom to top. The first intermediate layer 241 may include AlGaN, the second intermediate layer 242 may include AlGaN or aluminium nitride. The average composition of Al in the first intermediate layer 241 is less than that in the second intermediate layer 242. The second intermediate layer 242 may have a thickness greater than 2 nm. The multi-layer structure 24 may be n-type doped with silicon or/and germanium.

The active region may be selected from a light-emitting diode including a InGaN/GaN multiple quantum well structure and p-type nitride, a high electron mobility transistor including an AlGaN/GaN heterostructure, a high electron mobility transistor including an AlGaInN/GaN heterostructure, a high mobility transistor including an AlN/GaN heterostructure, a GaN MOSFET, a UV-LED, a photoelectric detector, a hydrogen generator or a solar cell.

The method for forming the epitaxial structure mentioned above may include:

(1) providing a substrate 21 including silicon, sapphire, patterned sapphire (PSS) or silicon carbide;

(2) forming a nitride nucleation layer 22 on the substrate 21 including silicon, sapphire, patterned sapphire (PSS) or silicon carbide, wherein a growth temperature of the nitride nucleation layer 22 is equal to or greater than 700° C.;

(3) forming a first nitride layer 231 on the nitride nucleation layer 22, wherein a growth temperature of the first nitride layer 231 is equal to or greater than 700° C.;

(4) forming a first intermediate layer 241 on the first nitride layer 231, wherein a growth temperature of the first intermediate layer 241 is equal to or greater than 700° C.;

(5) forming a second intermediate layer 242 on the first intermediate layer 241, wherein a growth temperature of the second intermediate layer 242 is equal to or greater than 700° C.;

(6) forming a second nitride layer 232 on the second intermediate layer 242, wherein a growth temperature of the second nitride layer 232 is equal to or greater than 700° C.; and (7) forming an active region on the second nitride layer 232.

In the second embodiment, the multi-layer structure 24 has a two-layer structure, wherein the first intermediate layer 241 is a thin AlGaN layer, the second intermediate layer 242 is an AlGaN layer rich in Al. The first intermediate layer 241 has an Al composition less than the second intermediate layer 242.

Figure 3:
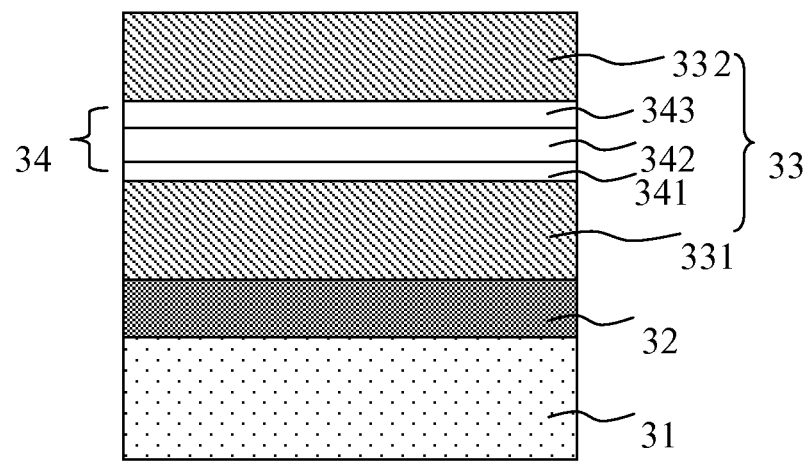
FIG. 3 schematically illustrates a cross-sectional view of a semiconductor epitaxial structure according to a third embodiment of the present disclosure.
Figure 4:
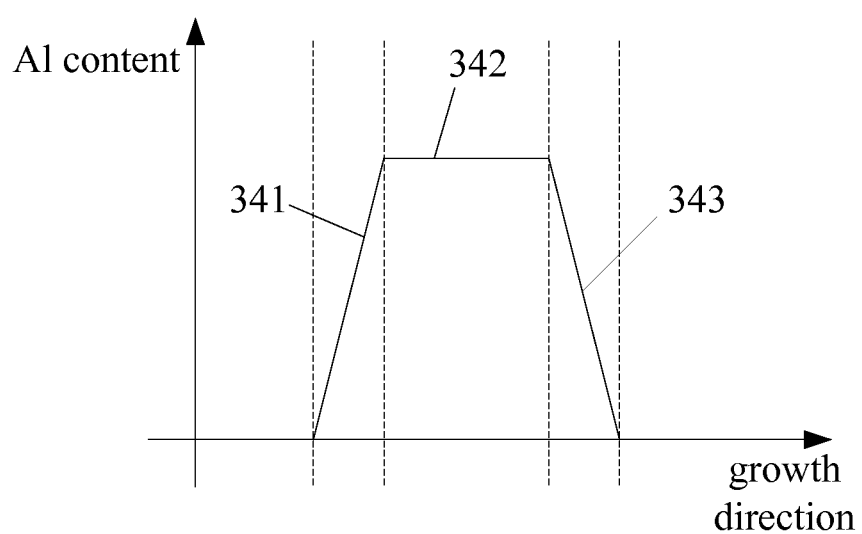
FIG. 4 illustrates a schematic diagram of a variation in Al composition in a multi-layer structure shown in FIG. 3.

FIG. 3 schematically illustrates a cross-sectional view of a semiconductor epitaxial structure according to a third embodiment of the present disclosure. FIG. 4 illustrates a schematic diagram of a variation in Al composition in a multi-layer structure shown in FIG. 3.

Referring to FIG. 3, an epitaxial structure is formed on a substrate 31 including silicon, sapphire, patterned sapphire (PSS) or silicon carbide, which has a structure similar to that illustrated in the first embodiment. Specifically, the epitaxial structure includes: a nitride nucleation layer 32, a nitride layer 33, a multi-layer structure 34 formed in the nitride layer 33 and an active region (not shown) formed on the nitride layer 33. The nitride layer 33 includes a first nitride layer 331 and a second nitride layer 332. The multi-layer structure 34 is formed between the first nitride layer 331 and the second nitride layer 332. The multi-layer structure 34 has a three-layer structure including a first intermediate layer 341, a second intermediate layer 342 and a third intermediate layer 343 from bottom to top.

Referring to FIG. 4, the difference between the epitaxial structures provided in the third embodiment and the first embodiment (the average composition of Al in each layer of the multi-layer structure 14 is distributed uniformly) is: the average composition of Al in the first intermediate layer 341 and the third intermediate layer 343 is varied gradually. The average composition of Al in the second intermediate layer 342 is distributed uniformly, and the average composition of Al in the first intermediate layer 341 is increased gradually from bottom to top (in a growth direction), and the average composition of Al in the third intermediate layer 343 is decreased gradually from bottom to top (in a growth direction). For the first intermediate layer and the third intermediate layer, the Al composition may not change linearly, which may increase or decrease stepwise, or change up and down. In some embodiments, for the second intermediate layer, the composition of Al may also change with its thickness.

Figure 5:
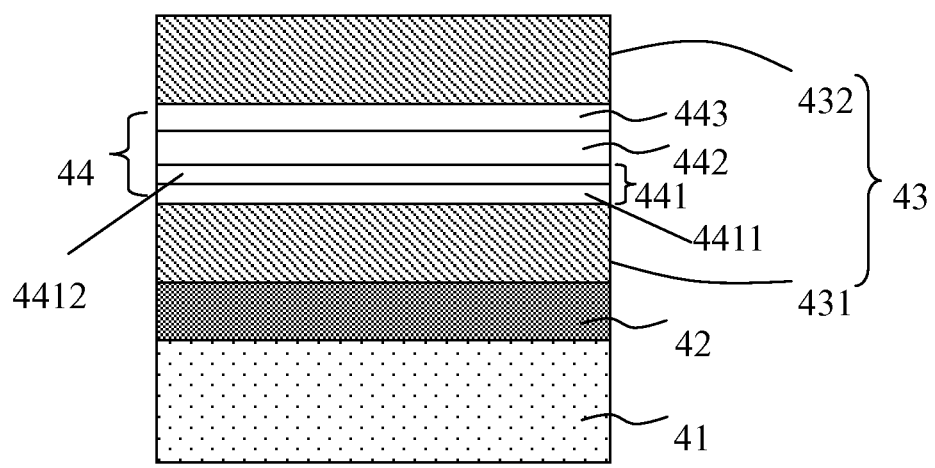
FIG. 5 schematically illustrates a cross-sectional view of a semiconductor epitaxial structure according to a fourth embodiment of the present disclosure.

FIG. 5 schematically illustrates a cross-sectional view of a semiconductor epitaxial structure according to a fourth embodiment of the present disclosure.

Referring to FIG. 5, an epitaxial structure is formed on a substrate 41 including silicon, sapphire, patterned sapphire (PSS) or silicon carbide, which has a structure similar to that illustrated in the first embodiment. Specifically, the epitaxial structure includes: a nitride nucleation layer 42, a nitride layer 43, a multi-layer structure 44 formed in the nitride layer 43 and an active region (not shown) formed on the nitride layer 43. The nitride layer 43 includes a first nitride layer 431 and a second nitride layer 432. The multi-layer structure 44 is formed between the first nitride layer 431 and the second nitride layer 432. The multi-layer structure 44 has a three-layer structure including a first intermediate layer 441, a second intermediate layer 442 and a third intermediate layer 443 from bottom to top.

The difference between the epitaxial structures provided in the fourth embodiment and the first embodiment is: the first intermediate layer 441 includes a GaN layer 4411 and an AlGaN layer 4412, wherein the GaN layer 4411 and the AlGaN layer 4412 may be repeatedly laminated to form a GaN/AlGaN superlattice structure. The superlattice structure may be formed of repeatedly laminated AlGaN/AlGaN. The third intermediate layer may include a superlattice structure.

In conclusion, the semiconductor epitaxial structure provided in embodiments of the present disclosure has a multi-layer structure in a nitride layer, wherein the multi-layer structure includes a first intermediate layer and a second intermediate layer formed on the first intermediate layer, the first intermediate layer may include AlGaN, the second intermediate layer may include AlGaN or aluminium nitride, and the average composition of Al in the first intermediate layer is less than that in the second intermediate layer. The stress can be controlled by adjusting the composition of Al in the multi-layer structure. However, in the prior art, it is difficult to form an epitaxial layer rich in Al on a nitride layer. A pre-stress layer is introduced in the present disclosure (the first intermediate layer or the third intermediate layer) to prevent gallium atoms from eroding the structure rich in Al. The pre-stress layer may change the growth pattern of the multi-layer structure rich in Al (the second intermediate layer), to achieve a satisfactory two-dimensional structure. Both the nitride layer and the multilayer intermediate layer are formed at a high temperature, which may avoid a complicated temperature ramping process when forming an AlN intermediate layer at a low temperature, thereby saving time and increasing manufacturing yield. Further, the degradation of the crystalline quality caused by the low temperature AlN intermediate layer can be avoided. Because all the structures are formed at a high temperature, the crystalline quality is improved greatly and the defects can be minimized.

For the purpose of description, the present disclosure is described with reference to several embodiments. It should be noted that not only a single technical solution is included in an embodiment. The technical solutions provided in embodiments of the present disclosure may be combined in a suitable way to obtain other embodiments which can be implemented by those skilled in the art.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

I claim:

1. A semiconductor epitaxial structure, comprising:
   a nitride nucleation layer formed on a substrate including silicon, sapphire, patterned sapphire substrate (PSS) or silicon carbide;
   a nitride layer including a first nitride layer and a second nitride layer formed on the nitride nucleation layer; and
   a multi-layer structure formed between the first nitride layer and the second nitride layer,
   wherein the multi-layer structure comprises a first intermediate layer and a second intermediate layer formed on the first intermediate layer, the first intermediate layer comprises AlGaN, the second intermediate layer comprises AlGaN or aluminium nitride, and the average composition of Al in the first intermediate layer is less than that in the second intermediate layer; and
   wherein a thickness of the second intermediate layer is greater than a critical thickness of the second intermediate layer and a growth stress in the second intermediate layer is partially or fully relaxed.

2. The semiconductor epitaxial structure according to claim 1, wherein the multi-layer structure further comprises a third intermediate layer formed on the second intermediate layer, wherein the third intermediate layer comprise AlGaN, and the average composition of Al in the third intermediate layer is less than that in the second intermediate layer.

3. The semiconductor epitaxial structure according to claim 2, wherein the average composition of Al in the third intermediate layer decreases gradually from bottom to top.

4. The semiconductor epitaxial structure according to claim 2, wherein the second intermediate layer has a thickness greater than 2 nm.

5. The semiconductor epitaxial structure according to claim 2, wherein the semiconductor epitaxial structure comprises an active region formed on the nitride layer, wherein the active region is selected from a light-emitting diode comprising a InGaN/GaN multiple quantum well structure and p-type nitride, a high electron mobility transistor comprising an AlGaN/GaN heterostructure, a high electron mobility transistor comprising an AlInGaN/GaN heterostructure, a high mobility transistor comprising an AlN/GaN heterostructure, a GaN MOSFET, a UV-LED, a photoelectric detector, a hydrogen generator or a solar cell.

6. The semiconductor epitaxial structure according to claim 2, wherein the average composition of Al in the first intermediate layer increases gradually from bottom to top.

7. The semiconductor epitaxial structure according to claim 1, wherein the first intermediate layer has a GaN/AlGaN, AlGaN/AlGaN or AlGaN/AlN superlattice structure.

8. The semiconductor epitaxial structure according to claim 1, wherein the second intermediate layer has a thickness greater than 2 nm.

9. The semiconductor epitaxial structure according to claim 1, wherein the semiconductor epitaxial structure comprises an active region formed on the nitride layer, wherein the active region is selected from a light-emitting diode comprising a InGaN/GaN multiple quantum well structure and p-type nitride, a high electron mobility transistor comprising an AlGaN/GaN heterostructure, a high electron mobility transistor comprising an AlInGaN/GaN heterostructure, a high mobility transistor comprising an AlN/GaN heterostructure, a GaN MOSFET, a UV-LED, a photoelectric detector, a hydrogen generator or a solar cell.

10. The semiconductor epitaxial structure according to claim 1, wherein the average composition of Al in the first intermediate layer increases gradually from bottom to top.

11. The semiconductor epitaxial structure according to claim 1, wherein the nitride nucleation layer comprises AlGaN, AlInGaN, aluminium nitride or gallium nitride.

12. The semiconductor epitaxial structure according to claim 1, wherein the nitride layer comprises gallium nitride, AlInGaN or AlGaN.

13. The semiconductor epitaxial structure according to claim 1, wherein the multi-layer structure is n-type doped with silicon or/and germanium.

14. The semiconductor epitaxial structure according to claim 1, wherein the nitride layer is n-type doped with silicon or/and germanium.

15. A method for forming a semiconductor epitaxial structure according to claim 1, comprising:

(1) providing a substrate including silicon, sapphire, patterned sapphire substrate (PSS) or silicon carbide;
(2) forming a nitride nucleation layer on the substrate including silicon, sapphire, patterned sapphire substrate (PSS) or silicon carbide;
(3) forming a first nitride layer on the nitride nucleation layer;
(4) forming a first intermediate layer on the first nitride layer;
(5) forming a second intermediate layer on the first intermediate layer, wherein a thickness of the second intermediate layer is greater than a critical thickness of the second intermediate layer and a growth stress in the second intermediate layer is partially or fully relaxed; and
(6) forming a second nitride layer on the second intermediate layer.

16. The method according to claim 15, wherein a growth temperature of the nitride nucleation layer is equal to or greater than 700° C.

17. The method according to claim 15, wherein a growth temperature of the first nitride layer or the second nitride layer is equal to or greater than 700° C.

18. The method according to claim 15, wherein a growth temperature of the first intermediate layer or the second intermediate layer is equal to or greater than 700° C.

* * * * *